(12) United States Patent
Seo

(10) Patent No.: US 9,454,998 B2
(45) Date of Patent: Sep. 27, 2016

(54) SEMICONDUCTOR DEVICE WITH POWER DISTRIBUTION NETWORK

(71) Applicant: SK hynix Inc., Gyeonggi-do (KR)

(72) Inventor: Jai-Hwan Seo, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 0 days.

(21) Appl. No.: 14/280,142

(22) Filed: May 16, 2014

(65) Prior Publication Data

US 2015/0170715 A1    Jun. 18, 2015

(30) Foreign Application Priority Data

Dec. 13, 2013  (KR) ........................ 10-2013-0155127

(51) Int. Cl.
*G11C 5/14* (2006.01)
*G11C 8/10* (2006.01)
*G11C 5/02* (2006.01)
*G11C 5/06* (2006.01)

(52) U.S. Cl.
CPC ................ *G11C 5/14* (2013.01); *G11C 5/025* (2013.01); *G11C 5/063* (2013.01); *G11C 8/10* (2013.01)

(58) Field of Classification Search
CPC ......... G11C 5/14; G11C 5/063; G11C 29/80; G11C 2207/105; G11C 13/0038; H01L 27/108
See application file for complete search history.

(56) References Cited

U.S. PATENT DOCUMENTS

| | | | | |
|---|---|---|---|---|
| 5,867,440 A * | 2/1999 | Hidaka | ...................... | G11C 5/14 365/226 |
| 6,028,341 A * | 2/2000 | Tai | ...................... | H01L 27/0266 257/372 |
| 6,043,562 A * | 3/2000 | Keeth | ...................... | G11C 7/18 257/210 |
| 6,327,214 B1 * | 12/2001 | Yoon | ..................... | G11C 7/1006 365/205 |
| 6,370,054 B1 * | 4/2002 | Fujisawa | ................ | G11C 5/025 257/E27.097 |
| 6,473,350 B2 * | 10/2002 | Lee | ............................ | G11C 7/12 365/149 |
| 7,177,216 B2 * | 2/2007 | Suh | ............................ | G11C 7/18 365/190 |
| 7,649,760 B2 * | 1/2010 | Hong | ................... | G11C 11/4091 365/205 |
| 8,357,958 B2 * | 1/2013 | Cummins | ............. | G01N 27/223 257/253 |
| 2007/0002617 A1 * | 1/2007 | Houston | ............... | G11C 11/412 365/185.07 |
| 2007/0247951 A1 * | 10/2007 | Kim | ......................... | G11C 5/14 365/227 |
| 2009/0122632 A1 * | 5/2009 | Kwak | ..................... | G11C 5/063 365/225.7 |
| 2012/0218835 A1 * | 8/2012 | Yun | ......................... | G11C 29/24 365/189.11 |

FOREIGN PATENT DOCUMENTS

| | | |
|---|---|---|
| KR | 1020100103992 | 9/2010 |
| KR | 101046275 | 7/2011 |
| KR | 20150063735 A * | 6/2015 |

* cited by examiner

*Primary Examiner* — Hoai V Ho
*Assistant Examiner* — Roberto Mancera
(74) *Attorney, Agent, or Firm* — IP & T Group LLP

(57) ABSTRACT

A semiconductor device that includes first to fourth banks spaced apart from each other in first and second directions, column control regions extending in the second direction between the first bank and the second bank and between the third bank and the fourth bank, and suitable for controlling column operations of the first to fourth banks, at least one power supply/ground voltage line extending in the second direction at one side edge of the first to fourth banks adjacent to the column control regions, and at least one power supply/ground voltage pad adjacent to and coupled with the at least one power supply/ground voltage line between the first bank and the third bank and between the second bank and the fourth bank, and suitable for receiving an external power supply voltage and a ground voltage.

11 Claims, 3 Drawing Sheets

SEMICONDUCTOR DEVICE WITH POWER DISTRIBUTION NETWORK

CROSS-REFERENCE TO RELATED APPLICATIONS

The present application claims priority of Korean Patent Application No. 10-2013-0155127, filed on Dec. 13, 2013, which is incorporated herein by reference in its entirety.

BACKGROUND

1. Field

Exemplary embodiments of the present invention relate to a semiconductor design technology, and more particularly, to a power distribution network scheme for effectively supplying a power supply voltage to a highly integrated semiconductor device.

2. Description of the Related Art

As the capacity and switching speed, i.e., operation rate, of semiconductor memories are increasing, the amount of current flowing through the power distribution network (PDN) of the semiconductor memories is also increasing. Thus, a voltage drop in the power distribution network (PDN) has emerged as a concern. In general, a tree structure power distribution network and a mesh-based power distribution network are used in semiconductor memories. The mesh-based power distribution network provides benefits such as less voltage drop and stable power delivery in comparison with the tree structure power distribution network.

In semiconductor memories used in the mobile or graphic industry, column and data paths are disposed perpendicularly to a power supply pad by changing the typical structure of a logic circuit associated with a row region and a column region. Thus, as a power drop occurs differentially in a direction perpendicular to the power supply pad, skew occurs in the column and data path signals. The skew may cause an error in a pipe latch for outputting data during a read operation and inaccurate data may be outputted. Accordingly, a column decoder is separated from a column control region, for controlling the column decoder, in order to reduce the skew occurring in the column and data path signals. When the column decoder is separated from the column control region, having a logic circuit related to data input and output, the error in the pipe latch may be reduced during the read operation but the power lines become weak. The weak power lines cause an error in the power distribution network (PDN). When an external power supply voltage is supplied to a plurality of banks and a voltage pad for supplying the external voltage is far, resistance increases and thus the power supply voltage is unstable. This is because the voltage drops of the multiple banks are different based on their position relative to the voltage pad. As the total resistance caused between the voltage pad and the banks is greater, more current is consumed.

SUMMARY

Exemplary embodiments of the present invention are directed to a semiconductor device that may improve power supply capacity of a voltage pad to each bank by forming power supply voltage lines and ground voltage lines on the edge of a core region and disposing the power supply voltage lines and the ground voltage lines perpendicularly to the direction that the voltage pad is aligned.

In accordance with an embodiment of the present invention, a semiconductor device includes a first bank; a second bank spaced apart from the first bank in a first direction; a third bank spaced apart from the first bank in a second direction perpendicular to the first direction; a fourth bank spaced apart from the second bank in the second direction and spaced apart from the third bank in the first direction; column control regions extending in the second direction between the first bank and the second bank and between the third bank and the fourth bank, and suitable for controlling column operations of the first to fourth banks; at least one power supply/ground voltage line extending in the second direction at one of the edges of the first to fourth banks adjacent to the column control regions; and at least one power supply/ground voltage pad formed adjacent to and coupled with the at least one power supply/ground voltage line between the first bank and the third bank and between the second bank and the fourth bank, and suitable for receiving an external power supply voltage and a ground voltage applied thereto.

In accordance with another embodiment of the present invention, a semiconductor device includes a first bank; a second bank spaced apart from the first bank in a first direction; at least one first power supply/ground voltage line extended in a second direction perpendicular to the first direction and formed adjacent to both side edges of the first bank; at least one second power supply/ground voltage line extended in the second direction and formed adjacent to both side edges of the second bank; at least one first power supply/ground voltage pad formed adjacent to and coupled with the at least one first power supply/ground voltage line on the lower side of the first bank, and suitable for receiving an external power supply voltage and a ground voltage applied thereto; and at least one second power supply/ground voltage pad formed adjacent to and coupled with the at least one second power supply/ground voltage line on the lower side of the second bank, and suitable for receiving an external power supply voltage and a ground voltage applied thereto.

In accordance with further embodiment of the present invention, a semiconductor device includes a plurality of banks disposed in first and second direction perpendicular to each other; at least one column control region extended in the second direction between banks disposed in the first direction, and suitable for controlling column operations of the banks; a plurality of power supply/ground voltage lines extending in the second direction at one of the edges of the respective banks adjacent to the at least one column control region; and a plurality of power supply/ground voltage pads coupled with the power supply/ground voltage lines, respectively, between banks disposed in the second direction, and suitable for receiving an external power supply voltage and a ground voltage applied thereto.

DETAILED DESCRIPTION

Exemplary embodiments of the present invention will be described below in more detail with reference to the accompanying drawings. These embodiments are provided so this disclosure will be thorough and complete, and will fully convey the scope of the present invention to those skilled in the art.

Figure 1:
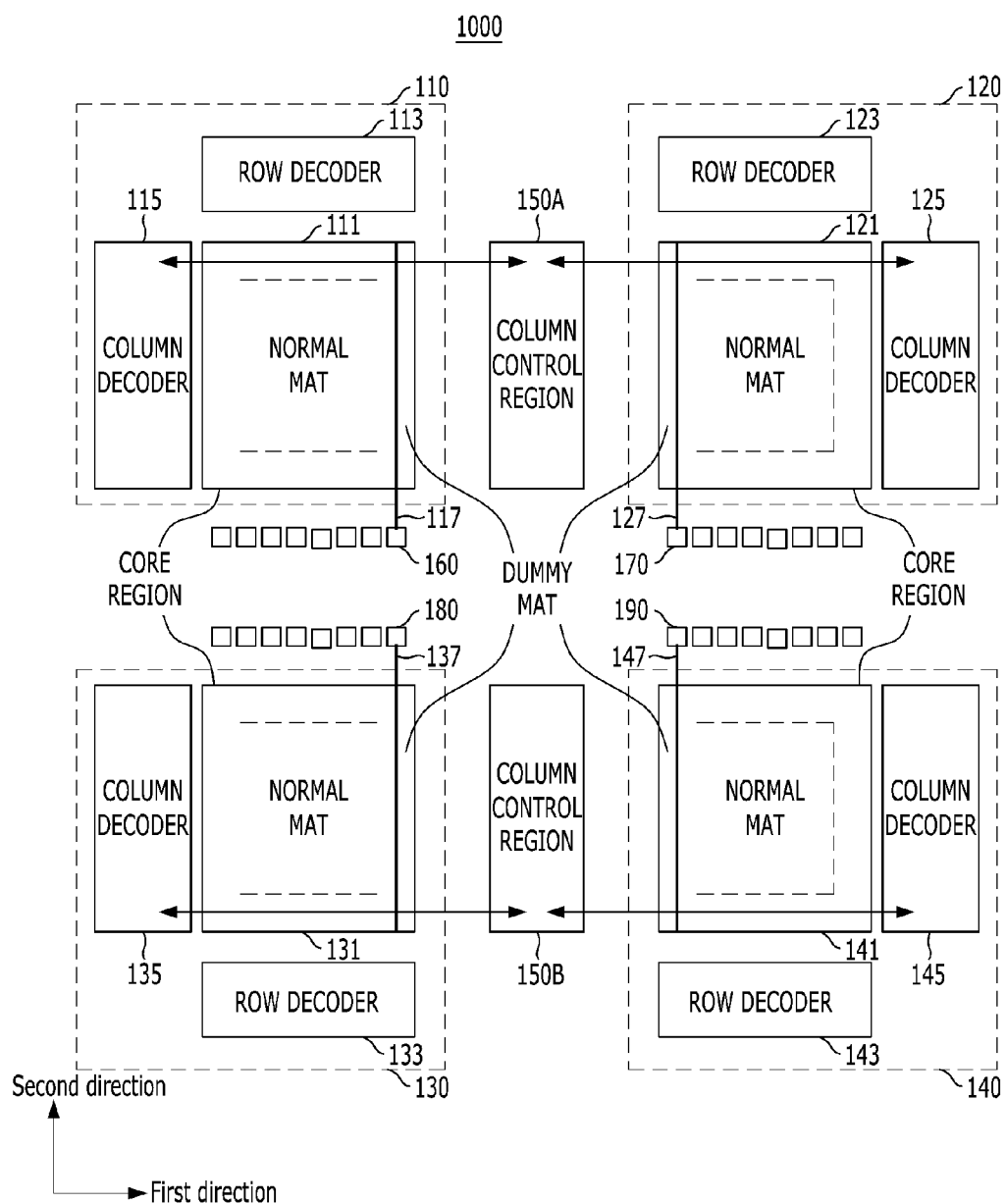
FIG. 1 is a block diagram illustrating a semiconductor device in accordance with a first embodiment of the present invention.

FIG. 1 is a block diagram illustrating a semiconductor device in accordance with a first embodiment of the present invention.

Referring to FIG. 1, the semiconductor device 1000 includes a first bank 110, a second bank 120, a third bank 130, a fourth bank 140, and column control regions 150A and 150B.

The second bank 120 may be disposed apart from the first bank 110 in a first direction, e.g., a horizontal direction. The third bank 130 may be disposed apart from the first bank 110 in a second direction, e.g., vertical direction. The fourth bank 140 may be disposed apart from the second bank 120 in the second direction and from the third bank 130 in the first direction.

The column control region 150A disposed on the upper part of the drawing between the two column control regions extends in the second direction, e.g., vertical direction, between the first bank 110 and the second bank 120, and includes a circuit for controlling the column operations of the first and second banks 110 and 120. The column control region 150B disposed on the lower part in the drawing between the two column control regions extends in the second direction, e.g., vertical direction, between the third bank 130 and the fourth bank 140, and includes a circuit for controlling the column operations of the third and fourth banks 130 and 140. Herein, the semiconductor device 1000 in accordance with the first embodiment of the present invention includes the column control regions 150A and 150B between the first bank 110 and the second bank 120 and between the third bank 130 and the fourth bank 140, but the column control regions 150A and 150B disposed between the banks may be peripheral circuit regions that are disposed between the banks and also function to control the banks.

The semiconductor device 1000 may also include one or more power supply/ground voltage lines 117, 127, 137 and 147 which are extended in the second direction, e.g., vertical direction, and located at one of the side edges of the first to fourth banks 110, 120, 130 and 140 that are adjacent to the column control regions 150A and 150B.

The semiconductor device 1000 includes one or more power supply/ground voltage pads 160, 170, 180 and 190 which are formed adjacent to and coupled with the power supply/ground voltage lines 117, 127, 137 and 147, respectively, between the first bank 110 and the third bank 130 and between the second bank 120 and the fourth bank 140. The power supply/ground voltage pads 160, 170, 180, and 190 receive external power supply/ground voltages. FIG. 1 shows a pad array including a plurality of power supply pads and data input/output pads for inputting/outputting data. The pad array is disposed in the first direction in the drawing, and the power supply/ground voltage lines 117, 127, 137 and 147 are disposed perpendicularly to the pad array.

Detailed structures of the semiconductor device 1000 will now be described.

The first to fourth banks 110, 120, 130 and 140 are formed of core regions 111, 121, 131 and 141, row decoders 113, 123, 133 and 143, and column decoders 115, 125, 135 and 145, respectively.

Each of the core regions 111, 121, 131 and 141 includes a normal mat and a dummy mat disposed on the edge of the normal mat. The normal mat is formed of a plurality of normal cells which perform an operation for reading and writing data, and the dummy mat is formed of a plurality of dummy cells which do not actually perform the operation. The dummy mat is disposed outside the normal cells to protect the normal cells from external interference. The power supply/ground voltage lines 117, 127, 137 and 147 may be disposed on the dummy mat.

The row decoders 113, 123, 133 and 143 are disposed in the first direction, e.g., horizontal direction, on the upper or lower side of the core regions 111, 121, 131 and 141, respectively, and perform a row decoding operation of the core regions 111, 121, 131 and 141. When the semiconductor device 1000 enters an active section, one word line (not shown) among a plurality of word lines included in the first to fourth banks 110, 120, 130 and 140 is activated. The row decoding operation is an operation of the row decoders 113, 123, 133 and 143 for activating the word line (not shown) in response to a row address (not shown).

The column decoders 115, 125, 135 and 145 are disposed in the second direction e.g., vertical direction, on the left or right side of the core regions 111, 121, 131 and 141, respectively, and perform a column decoding operation of the core regions 111, 121, 131 and 141. The column decoding operation decodes a column address (not shown) to enable a column selection signal (now shown) for selecting a bit line (not shown).

As described above, the power supply/ground voltage lines 117, 127, 137 and 147 are disposed on the dummy mat included in the core regions 111, 121, 131 and 141 of the first to fourth banks 110, 120, 130 and 140, respectively. The power supply/ground voltage lines 117, 127, 137 and 147 supply an external voltage from the power supply/ground voltage pads 160, 170, 180, and 190 to the corresponding banks and column control regions.

A typical core region having power lines has a structure in which a plurality of power lines including the power supply/ground voltage lines are disposed on the upper and lower sides of voltage pads in a direction where the pads are arrayed. Each of the power lines is formed of a plurality of lines, e.g., first to third lines, which are formed in different layers, and the multiple lines are coupled with each other through a contact and a coupling line. The second lines and the third lines are disposed in parallel on the different layers. In this structure, the second lines are disposed on the upper and lower sides of the pads and are coupled with each other by using the first lines in order to couple the power lines disposed on the upper and lower sides of the pads in a mesh type structure. There is a limitation in the power lines-structure where the power lines are coupled in the mesh type structure using the first lines. The purpose of the power lines arranged perpendicular to the pad arrays is to improve the power distribution network, but most of the power lines disposed perpendicularly to the power supply pad in the prior art are first lines of the core region. The improvement of the power distribution network is to use first lines that are relatively short in comparison with the power-mesh type configuration.

The third lines are disposed in the first direction on the edge of the banks. The power supply/ground voltage lines 117, 127, 137 and 147 of the semiconductor device 1000 in accordance with the first embodiment of the present invention are formed on the dummy cell mat and are extended in the second direction, e.g., vertical direction, from the power supply/ground voltage pads 160, 170, 180 and 190. The power supply/ground voltage lines 117, 127, 137 and 147 may be formed in the same layer as the third lines M3 (not shown). Therefore, the third lines disposed in the cell region are directly coupled with the power supply/ground voltage pads 160, 170, 180 and 190 without a particular coupling line, and the power supply capacity of the voltage pads, which supply the power to the banks and the column control regions, is improved. As a result, the power distribution network may be improved.

Figure 2:
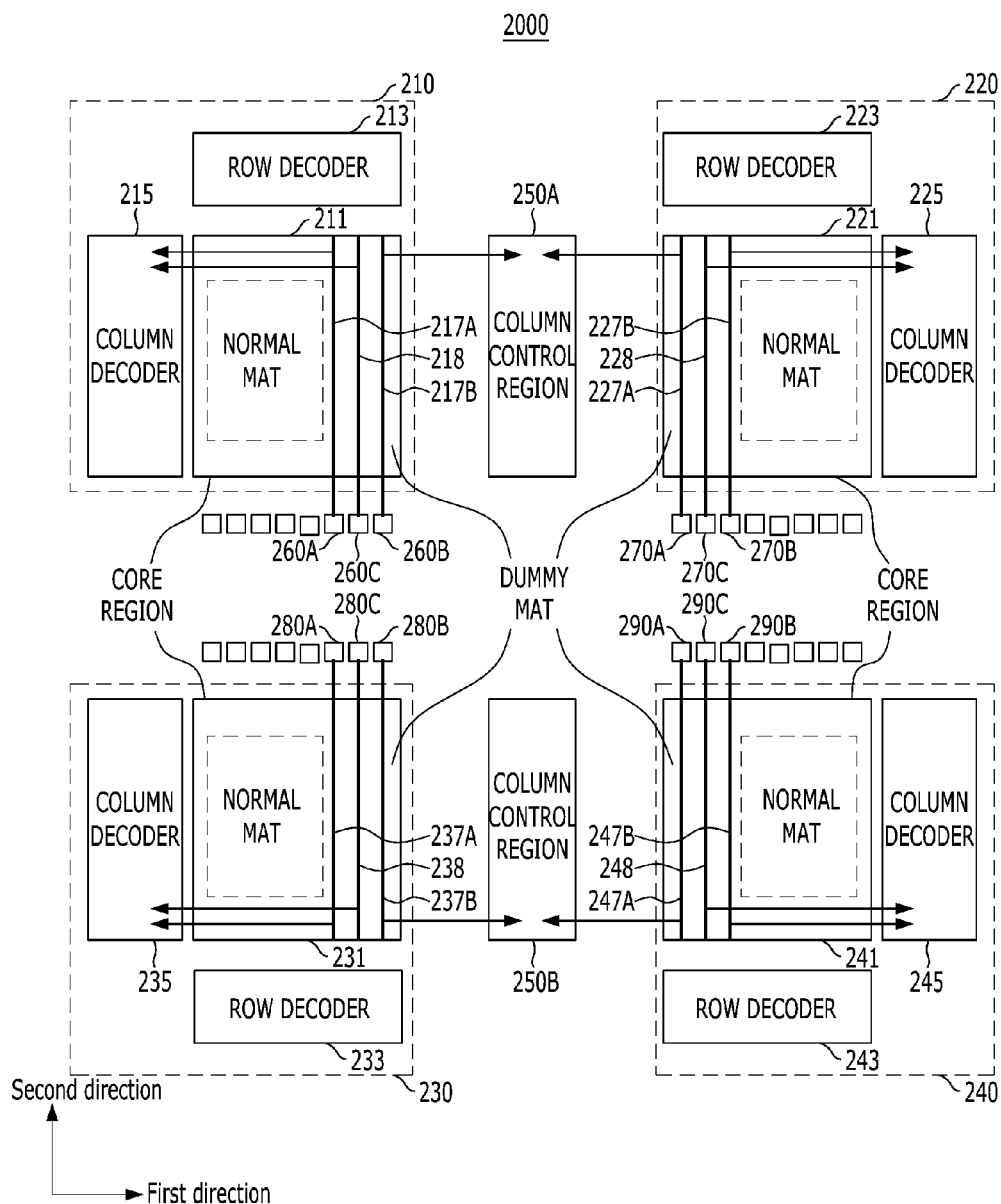
FIG. 2 is a block diagram illustrating a semiconductor device in accordance with a second embodiment of the present invention.

FIG. 2 is a block diagram illustrating a semiconductor device in accordance with a second embodiment of the present invention.

Referring to FIG. 2, the semiconductor device 2000 includes a first bank 210, a second bank 220, a third bank 230, a fourth bank 240, and column control regions 250A and 250B.

The second bank 220 is spaced apart from the first bank 210 in a first direction, e.g., horizontal direction. The third bank 230 is spaced apart from the first bank 210 in a second direction, e.g., vertical direction. The fourth bank 240 is spaced apart from the second bank 220 in the second direction and from the third bank 230 in the first direction.

The column control region 250A disposed on the upper side among the column control regions is extended in the second direction, e.g., vertical direction, between the first bank 210 and the second bank 220, and includes a circuit for controlling the column operation of the first and second banks 210 and 220. The column control region 250B disposed on the lower side among the column control regions extends in the second direction, e.g., vertical direction, between the third bank 230 and the fourth bank 240, and includes a circuit for controlling the column operation of the third and fourth banks 230 and 240. Herein, the semiconductor device 2000 in accordance with the second embodiment of the present invention includes the column control regions 250A and 250B between the first bank 210 and the second bank 220 and between the third bank 230 and the fourth bank 240, but the column control regions 250A and 250B disposed between the banks may be peripheral circuit regions for controlling the banks.

The semiconductor device 2000 includes first power supply voltage lines 217A, 227A, 237A and 247A, second power supply voltage lines 217B, 227B, 237B and 247B, and first ground voltage lines 218, 228, 238 and 248 which are extended in the second direction, e.g., vertical direction, and formed one of the side edges of the first to fourth banks 210, 220, 230 and 240 adjacent to the column control regions 250A and 250B. The first ground voltage lines 218, 228, 238 and 248 are disposed between the first power supply voltage lines 217A, 227A, 237A and 247A and the second power supply voltage lines 217B, 227B, 237B and 247B.

The semiconductor device 2000 includes first power supply voltage pads 260A, 270A, 280A and 290A, second power supply voltage pads 260B, 270B, 280B and 290B, and first ground voltage pads 260C, 270C, 280C and 290C which are formed adjacent to and coupled with the first power supply voltage lines 217A, 227A, 237A and 247A, the second power supply voltage lines 217B, 227B, 237B and 247B, and the first ground voltage lines 218, 228, 238 and 248, respectively, between the first bank 210 and the third bank 230 and between the second bank 220 and the fourth bank 240. The first and second power supply voltage pads and the first ground voltage pads are supplied with an external power supply voltage and a ground voltage, respectively. FIG. 2 shows a pad array including a plurality of power supply pads and data input/output pads for inputting and outputting data. The pad array is disposed in the first direction, and the first and second power supply voltage lines and the first ground voltage lines are disposed perpendicularly to the pad array.

Detailed structures of the semiconductor device 2000 will now be described.

The first to fourth banks 210, 220, 230 and 240 are formed of core regions 211, 221, 231 and 241, row decoders 213, 223, 233 and 243, and column decoders 215, 225, 235 and 245, respectively.

Each of the core regions 211, 221, 231 and 241 includes a normal mat and a dummy mat disposed on the edge of the normal mat. The normal mat is formed of a plurality of normal cells which perform an operation for reading and writing data, and the dummy mat is formed of a plurality of dummy cells which do not perform the operation. The dummy mat is disposed outside the normal cells and may protect the normal cells against external interference. The first power supply voltage lines 217A, 227A, 237A and 247A, the second power supply voltage lines 217B, 227B, 237B and 247B, and the first ground voltage lines 218, 228, 238 and 248 may be disposed on the dummy mat.

The row decoders 213, 223, 233 and 243 are disposed in the first direction, e.g., horizontal direction, on the upper or lower side of the core regions 211, 221, 231 and 241, respectively, and perform a row decoding operation of the core regions 211, 221, 231 and 241.

The column decoders 215, 225, 235 and 245 are disposed in the second direction, e.g., vertical direction on the left or right side of the core regions 211, 221, 231 and 241, respectively, and perform a column decoding operation of the core regions 211, 221, 231 and 241.

The first power supply voltage lines 217A, 227A, 237A and 247A, the second power supply voltage lines 217B 227B, 237B and 247B, and the first ground voltage lines 218, 228, 238 and 248 are disposed on the dummy mat included in the core regions 211, 221, 231 and 241 of the first to fourth banks 210, 220, 230 and 240, respectively.

The first power supply voltage lines 217A, 227A, 237A and 247A supply a power supply voltage VDD which is used for the banks 210, 220, 230 and 240. The second power supply voltage lines 217B, 227B, 237B and 247B supply the power supply voltage VDD which is used for the column control regions 250A and 250B.

The first ground voltage lines 218, 228, 238 and 248 are disposed between the first power supply voltage lines 217A, 227A, 237A and 247A and the second power supply voltage lines 217B, 227B, 237B and 247B so that the power may be easily supplied to the column control regions 250A and 250B or peripheral circuit regions (not shown) where various logic circuits are included and power consumption may converge. A power supply unit used in the semiconductor device may be divided into an external power supply unit and an internal power supply unit, and ground voltage VSS lines of the external power supply unit may be coupled with ground voltage VSS lines of the internal power supply unit.

Therefore, the power supply voltage VDD lines which are relatively short may effectively supply the power supply voltage VDD to each of the banks and the column control regions if the ground voltage VSS lines are disposed between the power supply voltage VDD lines in accordance with the second embodiment of the present invention.

As described above, in the power lines structure according to the prior art, the third lines M3 are disposed in the first direction, e.g., horizontal direction, in the cell regions and edges of the banks. The first power supply voltage lines 217A, 227A, 237A and 247A, the second power supply voltage lines 217B, 227B, 237B and 247B, and the first ground voltage lines 218, 228, 238 and 248 of the semiconductor device 2000 in accordance with the second embodiment of the present invention are formed on the dummy mat and are extended perpendicularly to the pad array. The first power supply voltage lines 217A, 227A, 237A and 247A, the second power supply voltage lines 217B, 227B, 237B and 247B, and the first ground voltage lines 218, 228, 238 and 248 may be formed on the same layer as the third lines M3. Therefore, the third lines M3 disposed in the cell region are directly coupled with the first power supply voltage pads 260A, 270A, 280A and 290A, the second power supply voltage pads 260B, 270B, 280B and 290B, and the first ground voltage pads 260C, 270C, 280C and 290C without a particular coupling line, and the power supply capacity of the voltage pads which supply the power to the banks and the column control regions is improved. As a result, the power distribution network may be improved.

Figure 3:
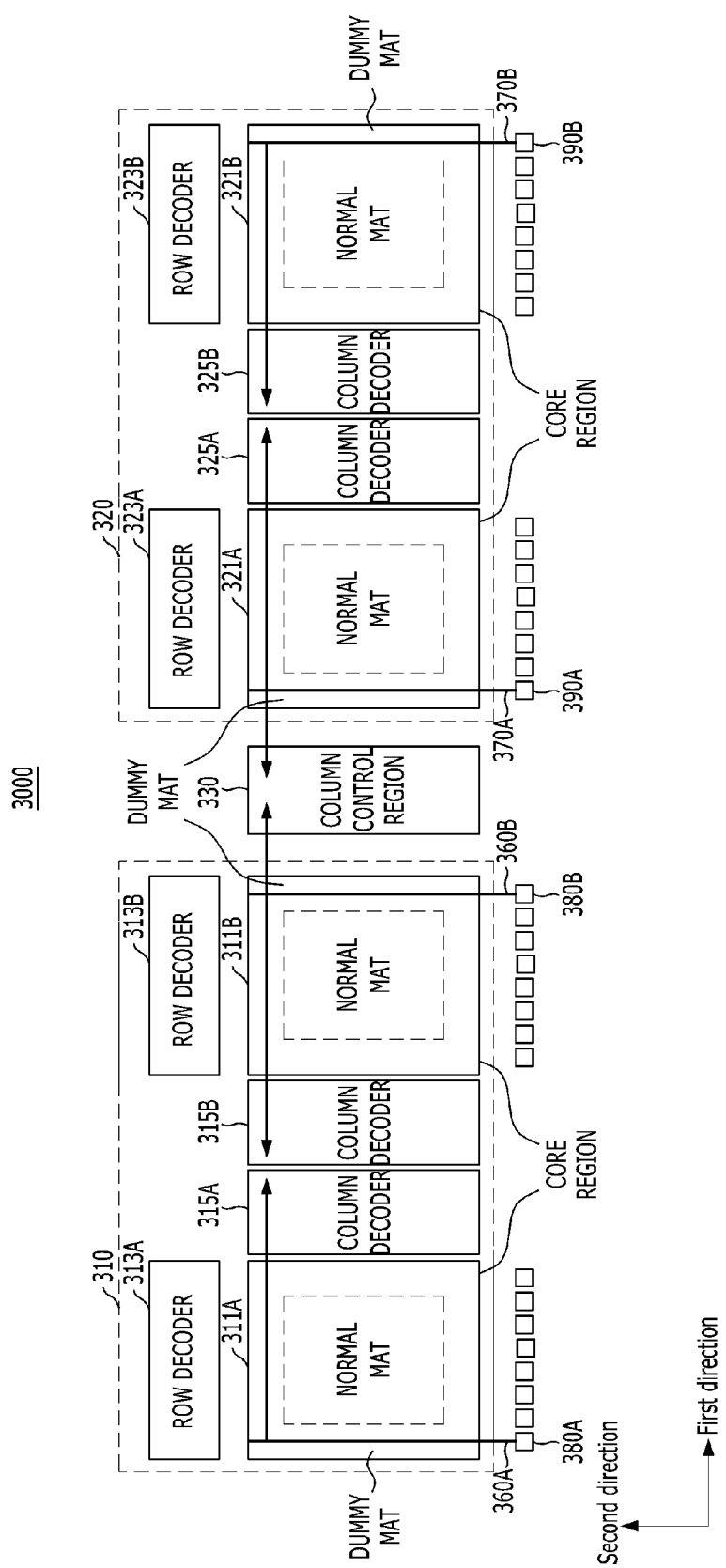
FIG. 3 is a block diagram illustrating a semiconductor device in accordance with a third embodiment of the present invention.

FIG. 3 is a block diagram illustrating a semiconductor device in accordance with a third embodiment of the present invention.

Referring to FIG. 3, the semiconductor device 3000 includes a first bank 310, a second bank 320, and a column control region 330. The second bank 320 is spaced apart from the first bank 310 in a first direction, e.g., horizontal direction.

The column control region 330 extends in a second direction, e.g., vertical direction, between the first bank 310 and the second bank 320, and includes a circuit for controlling the column operations of the first and second banks 310 and 320. The semiconductor device 3000 in accordance with the third embodiment of the present invention includes a column control region between the first bank 310 and the second bank 320, but the column control region disposed between the banks may be a peripheral circuit region for controlling the banks.

The semiconductor device 3000 includes one or more first power supply/ground voltage lines 360A and 360B which are extended in a second direction, e.g. vertical direction, and are formed adjacent to both horizontal edges of the first bank 310. The semiconductor device 3000 includes one or more second power supply/ground voltage lines 370A and 370B which are extended in the second direction and formed adjacent to both side edges of the second bank 320.

The semiconductor device 3000 includes one or more first power supply/ground voltage pads 380A and 380B which are formed adjacent to and coupled with the power supply/ground voltage lines 360A and 360B, respectively, on the lower side of the first bank 310. The first power supply/ground voltage pads 380A and 380B are supplied with external power supply/ground voltages.

The semiconductor device 3000 includes one or more second power supply/ground voltage pads 390A and 390B which are formed adjacent to and coupled with the power supply/ground voltage lines 370A and 370B, respectively, on the lower side of the first bank 310. The second power supply/ground voltage pads 390A and 390B are supplied with the external power supply/ground voltages.

FIG. 3 shows a pad array including a plurality of power supply pads and data input/output pads for inputting/outputting data. The pad array is disposed in the first direction, e.g., horizontal direction, and the first and second power supply/ground voltage lines are disposed perpendicularly to the pad array.

Detailed structures of the semiconductor device 3000 are now going to be described.

The first and second banks 310 and 320 are formed of core regions 311A, 311B, 321A and 321B, row decoders 313A, 313B 323A and 323B, and column decoders 315A, 315B, 325A and 325B, respectively.

Each of the core regions 311A, 311B, 321A and 321B includes a normal mat and a dummy mat disposed on the edge of the normal mat. The normal mat is formed of a plurality of normal cells which perform an operation for reading and writing data, and the dummy mat is formed of a plurality of dummy cells which do not actually perform the operation. The dummy mat is disposed outside the normal cells and may protect the normal cells against external interference. The first power supply/ground voltage lines 360A and 360B and the second power supply/ground voltage lines 370A and 370B may be disposed on the dummy mat.

The row decoders 313A, 313B, 323A and 323B are disposed in the first direction, e.g., horizontal direction, on the upper side of the core regions 311A, 311B, 321A and 321B, respectively, and perform a row decoding operation of the core regions 311A, 311B, 321A and 321B. When the semiconductor device 3000 enters an active section, one word line (not shown) among a plurality of word lines included in the first and second banks 310 and 320 is activated. The row decoding operation activates the word line (not shown) in response to a row address (not shown).

The column decoders 315A, 315B, 325A and 325B are disposed in the second direction, vertical direction, on the left or right side of the core regions 311A, 311B, 321A and 321B, respectively, and perform a column decoding operation of the core regions 311A, 311B, 321A and 321B. The column decoding operation decodes a column address (not shown) to enable a column selection signal (now shown) for selecting a bit line (not shown).

The first power supply/ground voltage lines 360A and 360B and the second power supply/ground voltage lines 370A and 370B are disposed on the dummy mat included in the core regions 311A, 321A and 321B of the first and second banks 310 and 320, respectively. The first power supply/ground voltage lines 360A and 360B and the second power supply/ground voltage lines 370A and 370B supply external voltages supplied from the first and second power supply/ground voltage pads 380A, 380B, 390A, and 390B to the corresponding banks and column control regions.

A typical core region having power lines has a structure where a plurality of power lines, including the power supply/ground voltage lines, are disposed on the upper and lower sides of voltage pads. Each of the power lines is formed of a plurality of lines, e.g., first to third lines, which are formed in different layers, and the multiple lines are coupled with each other through a contact and a coupling line. The second lines and the third lines are disposed in parallel in the different layers. In the mesh type structure, the second lines disposed on the upper and lower sides of the pads are coupled with each other by using the first lines M1 in order to couple the power lines disposed on the upper and lower sides of the pads. There is limitation in the power lines-structure where the power lines are coupled in the mesh type structure using the first lines. The number of the power lines arranged perpendicular to the pad arrays are increased in order to improve the power distribution network, but most of the power lines disposed perpendicularly to the power supply pad in the prior art are the first lines of the core region. However, this invention in-part suggests an improvement of the power distribution network by using the first lines which are shorter relative to the power-mesh type structure.

The third lines are disposed in the first direction on the edges and cell regions of the banks. The first power supply/ground voltage lines 360A and 360B and the second power supply/ground voltage lines 370A and 370B of the semiconductor device 3000 are formed on the dummy cell mat, and they are extended in the second direction in from the pad array. The first power supply/ground voltage lines 360A and 360B and the second power supply/ground voltage lines 370A and 370B may be formed on the same layer as the third lines (not shown). Therefore, the third lines disposed in the cell region are coupled directly with the power supply/ground voltage pads without a particular coupling line, and the power supply capacity of the voltage pads which supply the power to the banks and the column control regions is improved. As a result, the power distribution network may be improved.

In addition, the total resistance to the banks far from the voltage pads may be minimized since the power is supplied through the power supply/ground voltage lines corresponding to the power supply/ground voltage pads of the banks.

The semiconductor device in accordance with the embodiments of the present invention may improve the power distribution network characteristics by effectively supplying the external power supply/ground voltages to each of the banks and peripheral circuit regions through the power supply/ground voltage lines coupled directly with the power supply/ground voltage pads.

While the present invention has been described with respect to the specific embodiments, it should be noted that the embodiments are for describing, not limiting, the present invention. Further, it should be noted that the present invention may be achieved in various ways through substitution, change, and modification, by those skilled in the art without departing from the scope of the present invention as defined by the following claims.

What is claimed is:

1. A semiconductor device, comprising:
    a first bank;
    a second bank spaced apart from the first bank in a first direction;
    a third bank spaced apart from the first bank in a second direction perpendicular to the first direction;
    a fourth bank spaced apart from the second bank in the second direction and spaced apart from the third bank in the first direction;
    column control regions extending in the second direction between the first bank and the second bank and between the third bank and the fourth bank, and suitable for controlling column operations of the first to fourth banks;
    at least one power supply/ground voltage line extending in the second direction on a side of the first to fourth banks adjacent to the column control regions; and
    at least one power supply/ground voltage pads formed adjacent to and coupled with the at least one power supply/ground voltage line between the first bank and the third bank and between the second bank and the fourth bank, and suitable for receiving an external power supply voltage and a ground voltage,
    wherein each of the first to fourth banks comprises a core region including a normal mat and a dummy mat disposed on an edge of the normal mat that extends in the second direction and is adjacent to the column control region in the first direction, and
    wherein the at least one power supply/ground voltage line disposed on the dummy mat and a power line disposed on the normal mat are formed in a same layer.

2. The semiconductor device of claim 1, wherein each of the first to fourth banks further comprises:
    a row decoder disposed on the upper or lower side of the core region and suitable for performing a row decoding operation of the core region; and
    a column decoder disposed on the left or right side of the core region, spaced apart from the column control regions, and suitable for performing a column decoding operation of the core region.

3. The semiconductor device of claim 1, wherein the at least one power supply/ground voltage line includes:
    first and second power supply voltage lines disposed in parallel; and
    a first ground voltage line disposed between the first and second power supply voltage lines.

4. The semiconductor device of claim 3, wherein the one or more power supply/ground voltage pads each includes:
    first and second power supply voltage pads formed adjacent to and coupled with the first and second power supply voltage lines between the first bank and the third bank and between the second bank and the fourth bank, and suitable for receiving the external power supply voltage applied thereto; and
    a first ground voltage pad formed adjacent to and coupled with the first ground voltage line between the first bank and the third bank and between the second bank and the fourth bank, and suitable for receiving the ground voltage applied thereto.

5. The semiconductor device of claim 4, wherein the second power supply voltage line supplies the external power supply voltage used in the column control regions, while the first power supply voltage line supplies the external power supply voltage used in the banks.

6. A semiconductor device, comprising:
    a first bank;
    a second bank spaced apart from the first bank in a first direction;
    at least one first power supply/ground voltage line extended in a second direction perpendicular to the first direction and formed adjacent to both sides of the first bank;
    at least one second power supply/ground voltage line extended in the second direction and formed adjacent to both sides of the second bank;
    at least one first power supply/ground voltage pad formed adjacent to and coupled with the at least one first power supply/ground voltage line on the lower side of the first bank, and suitable for receiving an external power supply voltage and a ground voltage;
    at least one second power supply/ground voltage pad formed adjacent to and coupled with the at least one second power supply/ground voltage line on the lower side of the second bank, and suitable for receiving an the external power supply voltage and a ground voltage; and
    a column control region extending in the second direction between the first bank and the second bank and suitable for controlling column operations of the first and second banks,
    wherein each of the first and second banks comprises core regions including a normal mat and a dummy mat disposed on an edge of the normal mat that extends in the second direction and is adjacent to the column control region in the first direction, and
    wherein the at least one first power supply/ground voltage line and the at least one second power supply/ground voltage line disposed on the dummy mat and a power line disposed on the normal mat are formed in a same layer.

7. The semiconductor device of claim 6, wherein each of the first and second banks further comprises:
- row decoders disposed on the upper sides of the core regions, respectively, and suitable for performing a row decoding operation of the core regions; and
- column decoders disposed on the left or right sides of the core regions, respectively, and suitable for performing a column decoding operation of the core regions.

8. A semiconductor device, comprising:
- a plurality of banks disposed in first and second direction perpendicular to each other;
- at least one column control region extending in the second direction between banks disposed in the first direction, and suitable for controlling column operations of the banks;
- a plurality of power supply/ground voltage lines extending in the second direction on a side of the respective banks adjacent to the at least one column control region; and
- a plurality of power supply/ground voltage pads coupled with the power supply/ground voltage lines, respectively, between banks disposed in the second direction, and suitable for receiving an external power supply voltage and a ground voltage applied to the plurality of power supply/ground voltage pads,
- wherein each of the plurality of banks comprises a core region including a normal mat and a dummy mat disposed on a edge of the normal mat that extends in the first direction and is adjacent to the at least one column control region in the second direction, and
- wherein the plurality of power supply/ground voltage lines disposed on the dummy mat and a power line disposed on the normal mat are formed in a same layer.

9. The semiconductor device of claim 8, wherein the plurality of power supply/ground voltage lines each includes:
- first and second power supply voltage lines disposed in parallel; and
- a first ground voltage line disposed between the first and second power supply voltage lines,
- wherein the second power supply voltage line supplies the external power supply voltage to a corresponding column control region, while the first power supply voltage line supplies the external power supply voltage to a corresponding bank.

10. The semiconductor device of claim 8, wherein the plurality of power supply/ground voltage lines include:
- first power supply/ground voltage lines formed on a side of the respective banks adjacent to the at least one column control region; and
- second power supply/ground voltage lines formed on another side of the respective banks.

11. The semiconductor device of claim 8, wherein each of the plurality of banks further comprises:
- a row decoder disposed on the upper or lower side of the core region and suitable for performing a row decoding operation of the core region; and
- a column decoder disposed on the left or right side of the core region, spaced apart from the at least one column control region, and suitable for performing a column decoding operation of the core region.

* * * * *